United States Patent
Otani et al.

(10) Patent No.: US 6,677,577 B2
(45) Date of Patent: Jan. 13, 2004

(54) WAVEFORM MEASURING METHOD AND APPARATUS

(75) Inventors: Akihito Otani, Atsugi (JP); Toshinobu Otsubo, Atsugi (JP); Hiroto Watanabe, Atsugi (JP)

(73) Assignee: Anritsu Corporation, Tokyo (JP)

( * ) Notice: Subject to any disclaimer, the term of this patent is extended or adjusted under 35 U.S.C. 154(b) by 118 days.

(21) Appl. No.: 09/941,059

(22) Filed: Aug. 28, 2001

(65) Prior Publication Data

US 2002/0024002 A1 Feb. 28, 2002

(30) Foreign Application Priority Data

Aug. 31, 2000  (JP) ........................................ 2000-263591

(51) Int. Cl.[7] .............................. G01J 1/04; G01J 1/42; G01J 5/08
(52) U.S. Cl. ................ 250/227.14; 250/216; 324/76.39
(58) Field of Search ............................. 250/214 R, 216, 250/227.14, 227.17, 548, 559.3, 214 VT, 225; 377/53; 359/326, 495, 497; 385/11; 356/364, 73.1, 491; 324/76.39, 76.45, 76.41–76.42; 341/115, 118, 120

(56) References Cited

U.S. PATENT DOCUMENTS

| | | | |
|---|---|---|---|
| 4,962,353 A | 10/1990 | Takahashi et al. | |
| 5,801,375 A | * 9/1998 | Sasaki et al. | 250/216 |
| 5,828,983 A | 10/1998 | Lombardi | |
| 5,847,569 A | 12/1998 | Ho et al. | |
| 5,995,228 A | * 11/1999 | Otani et al. | 356/364 |
| 6,407,686 B1 | * 6/2002 | Otani et al. | 341/120 |
| 6,483,287 B2 | * 11/2002 | Otsubo et al. | 324/76.39 |

* cited by examiner

*Primary Examiner*—David Porta
*Assistant Examiner*—Patrick J Lee
(74) *Attorney, Agent, or Firm*—Frishauf, Holtz, Goodman & Chick, P.C.

(57) ABSTRACT

A common reference signal is applied from the same reference signal generating portion to a reference signal input terminal of a signal under test generator and a reference signal input terminal of a sampling signal generator circuit. A sampling frequency is set to the sampling signal generator circuit such that a desired delay time can be obtained relevant to a phase of a signal under test. In the sampling signal generator circuit, the sampling signal having a cycle that corresponds to the sampling frequency is generated based on the common reference signal and the sampling frequency. A repetition cycle of the signal under test and a repetition cycle of the sampling signal are set based on a cycle of the common reference signal so that the repetition cycle of the sampling signal can be set independently of the repetition cycle of the signal under test.

19 Claims, 7 Drawing Sheets

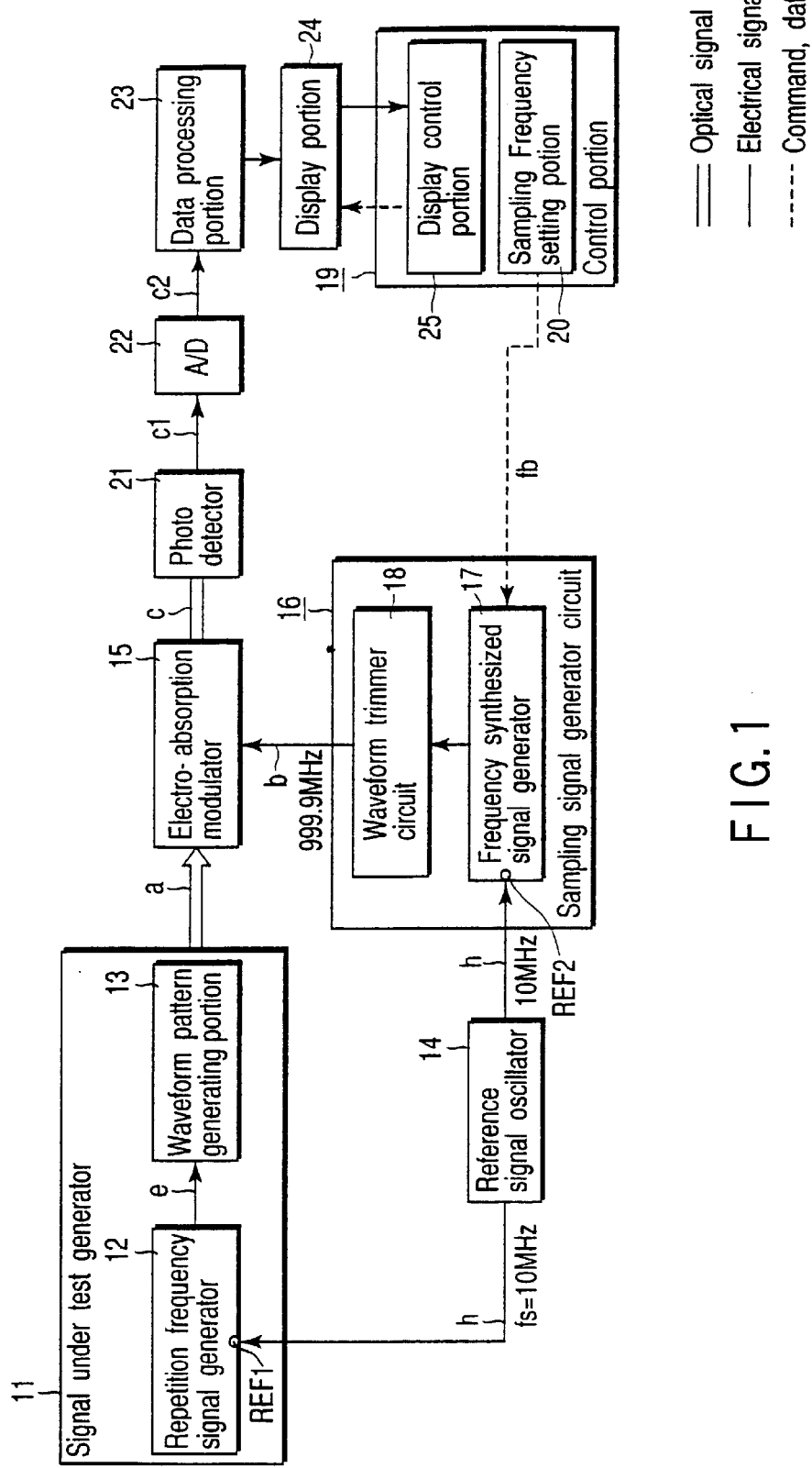
F I G. 1

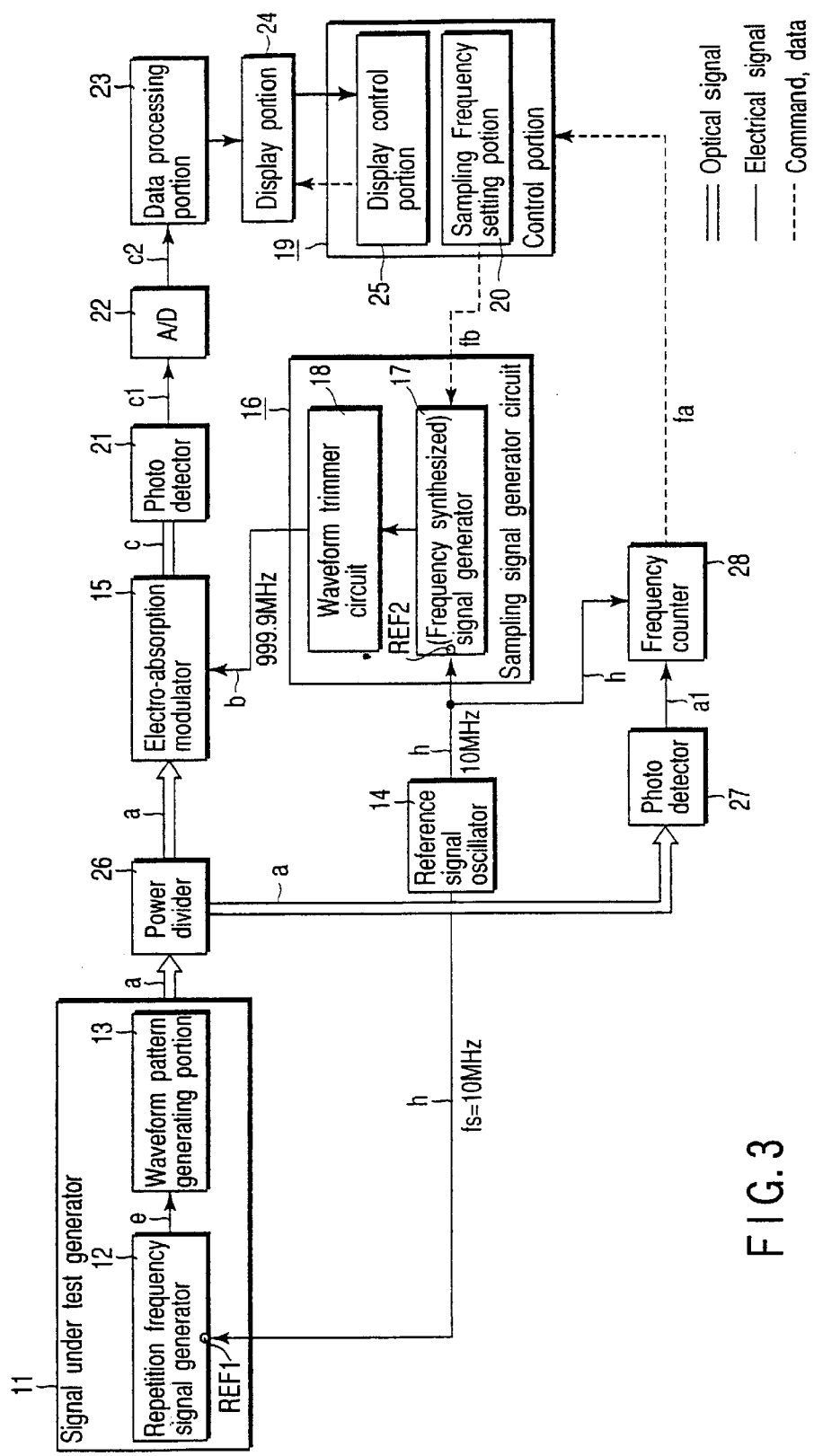
F I G. 3

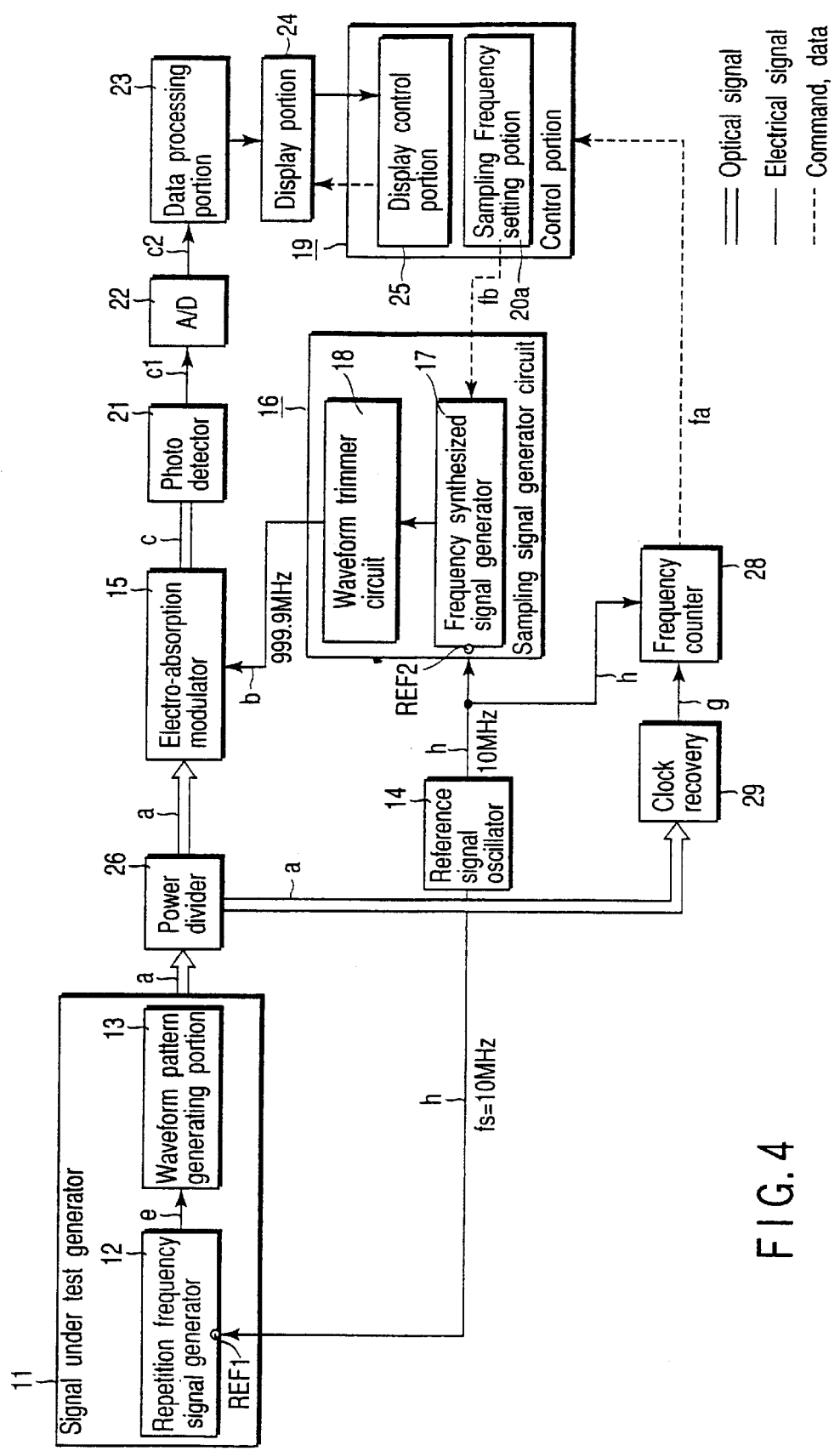
F I G. 4

FIG. 5D Reproduction clock signal 

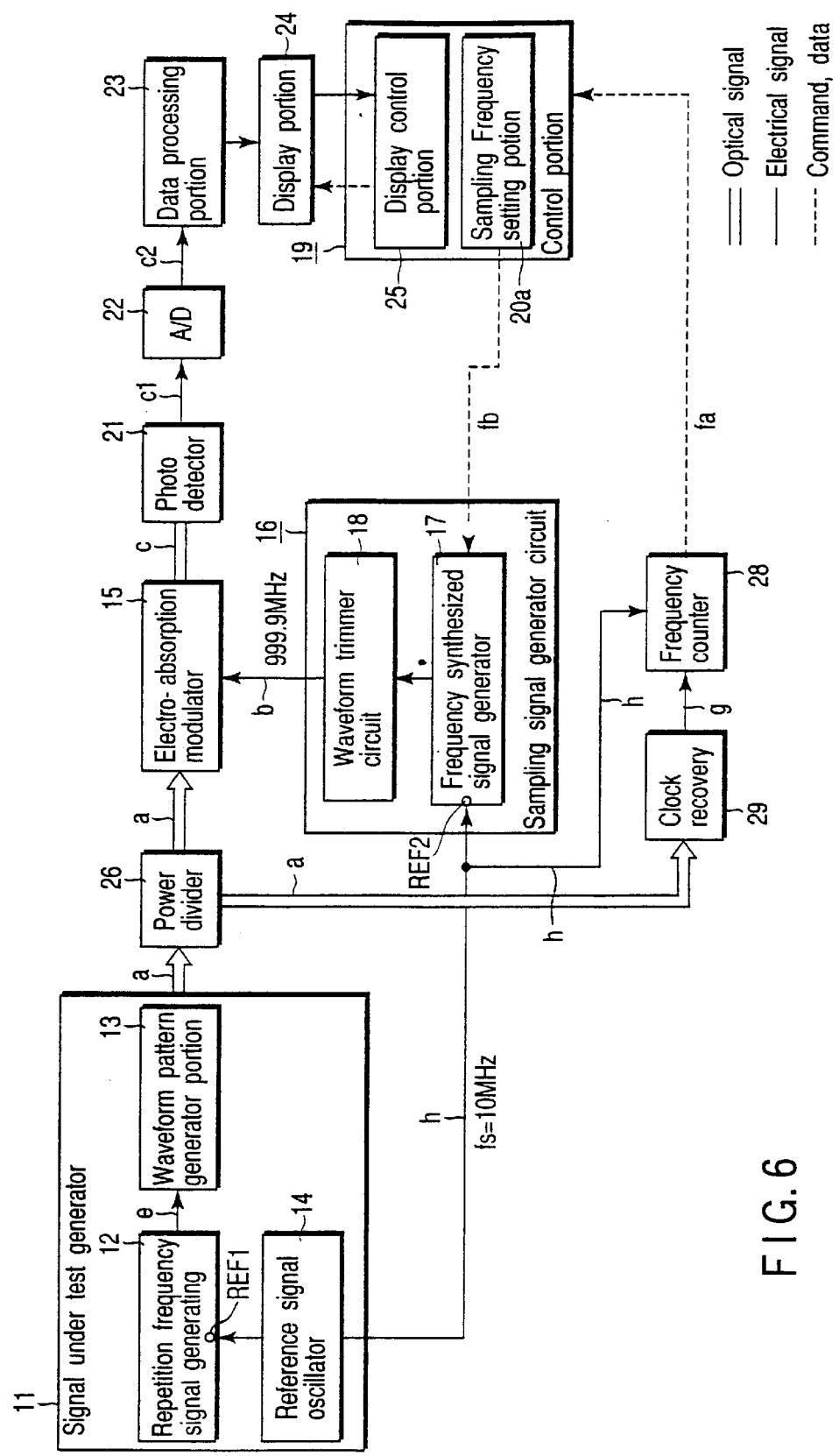
F I G. 6

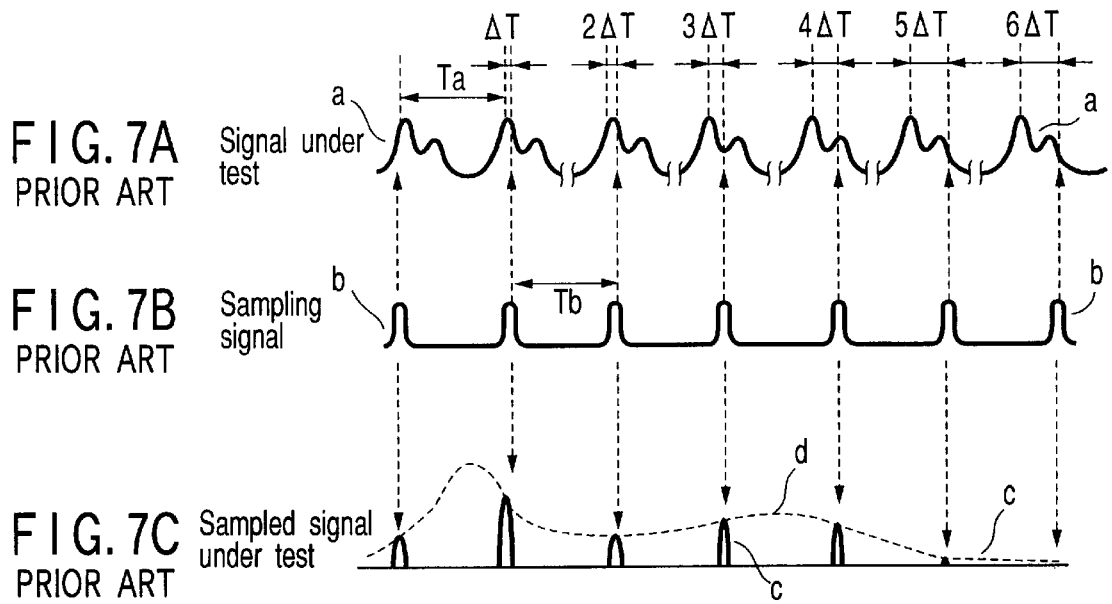
FIG. 7A PRIOR ART  Signal under test
FIG. 7B PRIOR ART  Sampling signal
FIG. 7C PRIOR ART  Sampled signal under test
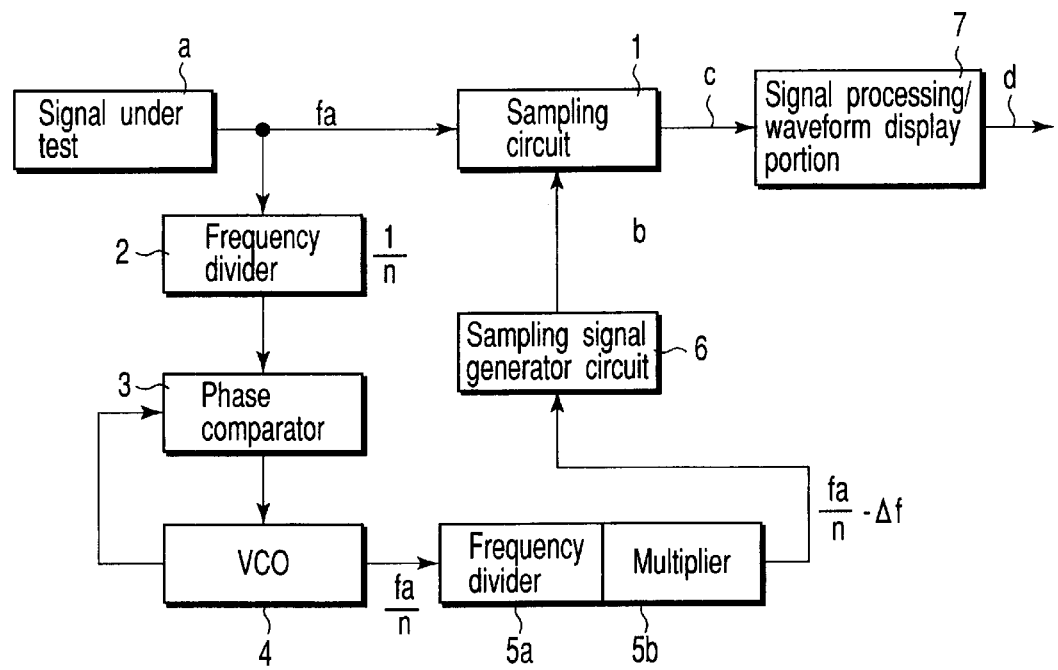
FIG. 8 PRIOR ART

WAVEFORM MEASURING METHOD AND APPARATUS

CROSS-REFERENCE TO RELATED APPLICATIONS

This application is based upon and claims the benefit of priority from the prior Japanese Patent Application No. 2000-263591, filed Aug. 31, 2000, the entire contents of which are incorporated herein by reference.

BACKGROUND OF THE INVENTION

1. Field of the Invention

The present invention relates to a waveform measuring method and apparatus. More particularly, the present invention relates to a waveform measuring method and apparatus for obtaining a signal waveform of a signal under test having an arbitrary repetition cycle outputted from a signal under test generator as a test object.

2. Description of the Related Art

In general, a signal under test generator for generating an electrical signal, an optical signal or the like each having an arbitrary repetition cycle incorporates a reference signal oscillator for generating a reference signal that has a reference frequency "fs" and a waveform pattern generating portion for generating a waveform pattern of a signal waveform.

In such a signal under test generator, a reference signal outputted from the reference signal generator is employed so as to generate a repetition frequency signal that has a specified repetition frequency "fa". In addition, this repetition frequency signal and a waveform pattern outputted from the waveform pattern generating portion are employed so as to generate an electrical signal or an optical signal each having an arbitrary repetition cycle "Ta".

The electrical signal and optical signal each having an arbitrary repetition cycle Ta outputted from such a signal under test generator are generally incorporated in an information communication system, and, for example, are employed as test signals of a variety of communication devices including an optical transmission cable.

Therefore, it is required to measure characteristics of the electrical signal or optical signal outputted from the signal under test generator in detail prior to testing a variety of communication devices containing the optical transmission cable incorporated in the information communication system.

One of the characteristic measurements of the electrical signal or optical signal is a signal waveform measurement.

Conventionally, there is proposed a variety of measuring techniques for measuring a signal waveform of a signal under test such as the electrical signal, optical signal or the like each having this arbitrary repetition cycle Ta.

However, in the case where the repetition cycle Ta of the signal under test, i.e., the repetition frequency "fa" is a high frequency signal that exceeds 10 GHz, the signal waveform of such a signal under test cannot be directly observed on a display screen such as oscilloscope. Thus, the selection range of the waveform measuring technique itself is limited.

A typical technique of measuring a signal waveform of a signal under test of which the repetition frequency "fa" exceeds 10 GHz will be described with reference to FIGS. 7A, 7B, and 7C.

As shown in FIGS. 7A and 7B, a signal under test "a" having a repetition cycle Ta (for example, repetition frequency "fa"=10 GHz) is sampled by a sampling signal "b" having a cycle Tb (for example, repetition frequency "fb"= 999.9 MHz) longer than the repetition cycle Ta of this signal under test "a".

In this case, a mutual relationship between the repetition periods Ta and Tb is adjusted, whereby the sampling position of a sampling signal "b" in the signal waveform in the repetition cycle Ta of the signal under test "a" is shifted by a differential time $\Delta T$ together with an elapse of time, as shown in FIGS. 7A and 7B, and is provided so as to be delayed as $\Delta T$, $2\Delta T$, $3\Delta T$, $4\Delta T$, $5\Delta T$, $6\Delta T$ . . . .

Therefore, a signal under test "c" after sampled by this sampling signal "b" is obtained as discrete waveform in which a pulse shaped waveform is generated at a position synchronized with the sampling signal "b", as shown in FIG. 7C.

Then, the enveloped waveform of each pulse shaped waveform is obtained as a signal waveform "d" extended in a time axis direction of the signal under test "a".

A waveform measuring apparatus for measuring a signal waveform "d" of the signal under test "a" is configured as shown in FIG. 8, for example, based on the principle of the sampling technique shown in FIGS. 7A, 7B, and 7C.

The signal under test "a" having the repetition frequency "fa" (repetition cycle Ta) is inputted to a sampling circuit 1 and a frequency divider 2.

The frequency divider 2 delivers to a phase comparator 3 an output signal obtained by frequency dividing the repetition frequency "fa" of the signal under test "a" into 1/n.

A voltage control oscillator (VCO) 4 functions as a phase locked loop (PLL) for generating a signal that has a frequency (fa/n) of 1/n (n: positive integer) of the repetition frequency "fa" so as to feed the signal back to the phase comparator 3.

The phase comparator 3 configuring the phase locked loop (PLL) detects a phase difference between a phase of an output signal of the voltage control oscillator (VCO) 4 and an output of the frequency divider 2, and delivers a phase difference signal to the voltage control oscillator (VCO) 4.

A phase of an output signal from the voltage control oscillator (VCO) 4 is synchronized with a phase of the signal under test "a" by means of this phase locked loop (PLL).

A frequency (fa/n) of an output signal having a frequency (fa/n) outputted from the voltage control oscillator (VCO) 4 is converted into a frequency of (fa/n)–$\Delta f$ by means of a next stationary frequency divider 5a and a stationary multiplier 5b, and the converted frequency is inputted to a sampling signal generator circuit 6.

Here, the sampling signal generator circuit 6 applies to the sampling circuit 1 a repetition frequency (fb) as shown in formula (1) synchronized with an inputted output signal and a sampling signal "b" having a repetition cycle (Tb).

$$fb = (fa/n) - \Delta f \quad (1)$$

$$Tb = (nTa) + \Delta T \quad (2)$$

However, a relationship between $\Delta f$ and $\Delta T$ is shown in formula (3)

$$\Delta f / \Delta T = fa^2 / n^2 \quad (3)$$

Then, the sampling circuit 1 samples the inputted signal under test "a" by means of the sampling signal "b" inputted from the sampling signal generator circuit 6, thereby delivering the sampled signal under test "c" to a next signal processing/waveform display portion 7.

This signal processing/waveform display portion 7 calculates an enveloped waveform of the inputted signal under test "c" after sampled, and a scale of a time axis of this enveloped waveform is converted into a scale of the original signal under test "a", whereby the signal waveform "d" of the original signal under test "a" is outputted to be displayed.

In this case, a magnification ratio of the signal under test "a" of the measured, enveloped waveform to the signal waveform "d" is obtained as (fa/nΔf).

In the case where the signal under test "a" is an optical signal instead of an electrical signal, this optical signal is applied to the frequency divider 2 after converted into an electrical signal.

In addition, in the case where the signal under test "a" is an optical signal instead of an electrical signal, an electro-absorption modulator, for example, is employed instead of the sampling circuit 1.

This electro-absorption modulator is applied a pulse shaped electric field that is a sampling signal, thereby making it possible to sample the pulse shaped signal under test "a" that is an optical signal that is inputted to the electro-adsorption modulator.

Then, the signal under test "c" that is the thus sampled optical signal is delivered to a signal processing/waveform display portion 7 after converted into an electrical signal.

However, a conventional waveform measuring apparatus employing a sampling technique shown in FIG. 8 has the following problems to be solved.

That is, an output signal from a multiplier 5b for generating a sampling signal "b" that has a repetition frequency fb=(fa/n)−Δf outputted from the sampling signal generator circuit 6 is produced by means of a phase locked loop (PLL) circuit composed of a frequency divider 2 for frequency dividing the signal under test "a", a phase comparator 3, and a voltage control oscillator (VCO) 4.

That is, the sampling signal "b" is produced by processing the signal under test "a" targeted to be measured, and thus, such sampling signal "b" is always phase synchronized with the signal under test "a".

Therefore, a generated quantity of jitter in the signal waveform "d" of the signal under test "a" displayed at the signal processing/waveform display portion 7 is restricted, and thus, the measurement precision of the signal waveform "d" of the signal under test "a" is improved.

However, the repetition frequency "fb" of the sampling signal "b" is expressed by a function of the repetition frequency "fa" of the signal under test "a", as is evident from formulas (1) and (3) described previously.

This fact means that the repetition frequency "fb" of the sampling signal "b" cannot be arbitrarily set independently of the repetition frequency "fa" of the signal under test "a" when a frequency dividing rate and a frequency multiplied rate are fixed.

That is, when the repetition frequency "fa" of the signal under test "a" changes, the time resolution, i.e., measurement precision of the signal waveform "d" of the measured signal under test "a" automatically changes.

Therefore, in this waveform measuring apparatus, the signal waveform "d" of the signal under test "a" cannot be measured with an arbitrary time resolution.

In addition, there is a problem that the selection range of the repetition frequency "fb" of the sampling signal "b" is greatly limited due to the specification characteristics or the like of each of the frequency dividers 2 and 5a.

BRIEF SUMMARY OF THE INVENTION

The present invention has been made in order to solve the foregoing problem. It is an object of the present invention to provide a waveform measuring method and apparatus capable of arbitrarily setting a frequency of a sampling signal for sampling a signal under test outputted from a signal under test generator targeted for testing independently of a repetition frequency of a signal under test while a sampling signal is always phase synchronized with a signal under test by generating a repetition cycle of a signal under test and a cycle of a sampling signal by means of a common reference signal, and capable of improving measurement precision of a signal waveform of a signal under test while a generated quantity of jitter is restricted, and capable of measuring the signal waveform with arbitrary resolution precision.

In order to achieve the foregoing object, according to a first aspect of the present invention, there is provided a waveform measuring method for generating a sampling signal that has a cycle longer than a repetition cycle of a signal under test outputted from a signal under test generator from a sampling signal generator circuit, sampling the signal under test by means of the sampling signal, and obtaining an enveloped waveform of the signal under test, the waveform measuring method comprising the steps of:

applying a common reference signal from the same reference signal generating portion to a reference signal input terminal of the signal under test generator and a reference signal input terminal of a sampling signal generator circuit;

setting to the sampling signal generator circuit a sampling frequency such that a desired delay time can be obtained relevant to a phase of the signal under test; and generating the sampling signal having a cycle that corresponds to the sampling frequency based on the common reference signal and the sampling frequency in the sampling signal generator circuit, wherein a repetition cycle of the signal under test and a repetition cycle of the sampling signal are set based on a cycle of the common reference signal so that the repetition cycle of the sampling signal can be set independently of the repetition cycle of the signal under test.

In this way, in the waveform measuring method, in the case where a reference signal oscillator for generating a reference signal that has a reference frequency employed for generating a repetition frequency of a signal under test is not provided in a signal generator targeted for testing, the signal generator outputting a signal under test of which a signal waveform is measured, an externally applied reference signal is employed to the reference signal input terminal.

Then, a common reference signal outputted from a reference signal oscillator provided at the outside of a signal under test generator is supplied to sampling signal generating means and a signal generator.

Therefore, in this case, the sampling signal and signal under test always maintain a phase synchronized state.

Moreover, the sampling signal is obtained by processing a reference signal instead of processing a signal under test.

Hence, with a simple configuration, a repetition frequency of a sampling signal for sampling a signal under test can be arbitrarily set independently of a repetition frequency of a signal under test, and a phase synchronization with a signal under test is always obtained. Thus, jitter generation is restricted.

In addition, in such a waveform measuring method, in the case where a reference signal oscillator for generating a reference signal that has a reference frequency employed for generating a repetition frequency of a signal under test is provided in a signal generator targeted for testing, the signal generator outputting a signal under test of which a signal waveform is measured, a sampling signal is generated by employing a reference signal outputted from a reference signal oscillator provided in a signal generator targeted for testing, contrary to the above description.

Therefore, in this case, the signal under test and sampling signal are generated by employing a common reference signal outputted from the same reference signal oscillator, thus making it possible to achieve the same advantageous effect as the above described case.

In order to achieve the foregoing object, according to a second aspect of the present invention, there is provided a waveform measuring apparatus having a sampling signal generator circuit for generating a sampling signal that has a cycle longer than a repetition cycle of a signal under test outputted from a signal under test generator; a sampling portion for sampling the signal under test by means of a sampling signal from the sampling signal generator circuit; and a data processing portion for obtaining an enveloped waveform of the signal under test sampled by means of the sampling portion, thereby obtaining a signal waveform of the signal under test, the measuring apparatus comprising:

a reference signal generating portion for applying a common reference signal to a reference signal input terminal of the signal under test generator and a reference signal input terminal of the sampling signal generator circuit; and a sampling frequency setting portion for setting to the sampling signal generator circuit a sampling frequency such that a desired delay time can be obtained relevant to a phase of the signal under test, wherein, in the sampling signal generator circuit, when the sampling signal having a cycle that corresponds to the sampling frequency is generated based on the common reference signal and the sampling frequency, the repetition cycle of the signal under test and the repetition cycle of the sampling signal are set based on a cycle of the common reference signal so that the repetition cycle of the sampling signal can be set independently of the repetition cycle of the signal under test.

In the thus configured waveform measuring apparatus, a reference signal oscillator for generating a reference signal that has a reference frequency employed for generating a repetition frequency of a signal under test is not provided in a signal generator targeted for testing, the signal generator outputting a signal under test of which a signal waveform is measured, and a reference signal externally applied to a reference signal input terminal of a signal generator targeted for testing is employed.

Then, a common signal outputted from the same reference signal oscillator provided at the waveform measuring apparatus is applied to sampling signal generating means and a signal under test generator.

Therefore, a sampling signal and a signal under test always maintains a phase synchronized state.

Moreover, a sampling signal is obtained by processing a reference signal instead of processing a signal under test.

Hence, with a simple configuration, a repetition frequency of a sampling signal for sampling a signal under test can be arbitrarily set independent of a repetition frequency of a signal under test. In addition, a phase synchronization is always obtained relative to a signal under test, and thus, jitter generation is restricted.

In addition, in order to achieve the foregoing object, according to a third aspect of the present invention, there is provided a waveform measuring apparatus in accordance with the second aspect, further comprising a frequency measuring portion for measuring a repetition frequency of the signal under test, based on the reference signal output from the reference signal oscillator, wherein the measurement value of the repetition frequency of the signal under test measured by means of the frequency measuring portion is assigned to the sampling frequency setting portion.

In addition, in order to achieve the foregoing object, according to a fourth aspect of the present invention, there is provided a waveform measuring apparatus in accordance with the second aspect, the waveform measuring apparatus further comprising:

a power divider for, when the signal under test is an optical signal, power dividing the signal under test that is the optical signal into two ways;

a photo detector for converting into a signal under test of an electrical signal a signal under test that is one of the optical signals divided by the power divider; and a frequency measuring portion for measuring a repetition frequency of a signal under test converted into an electrical signal by means of the photo detector, based on the reference signal output from the reference signal oscillator, wherein the measurement value of the repetition frequency of the signal under test measured by means of the frequency measuring portion is assigned to the sampling frequency setting portion.

In addition, in order to achieve the foregoing object, according to a fifth aspect of the present invention, there is provided a waveform measuring apparatus in accordance with the second aspect, further comprising:

a power divider for, when the signal under test is an optical signal, power dividing the signal under test that is the optical signal in two ways;

a clock recovery for detecting a clock of the repetition cycle from one signal under test divided by the power divider, thereby converting the signal under test that is the optical signal into a signal under test of an electrical signal having the repetition frequency and outputting the converted electrical signal; and a frequency measuring portion for measuring a repetition frequency of a signal under test converted into an electrical signal by the clock recovery, based on the reference signal output from the reference signal oscillator, wherein the measurement value of the repetition frequency of the signal under test measured by means of the frequency measuring portion is assigned to the sampling frequency setting portion.

In addition, in order to achieve the foregoing object, according to a sixth aspect of the present invention, there is provided a waveform measuring apparatus in accordance with the second aspect, the waveform measuring apparatus further comprising:

a photo detector for light receiving a signal under test of an optical signal sampled by means of a sampling signal of which a signal under test being the optical signal is inputted from the sampling signal generator circuit, and converting into a signal under test of an electrical signal as a signal under test that is an optical signal after sampled;

an analog/digital converter for converting a signal under test converted into an electrical signal by means of the photo detector into a digital signal under test, thereby delivering the converted digital signal under test to the data processing portion; and a display for converting a scale of a time axis of the enveloped waveform obtained by means of the data processing portion into a scale of an original signal under test, and displaying the converted scale as a signal waveform of the signal under test.

In addition, in order to achieve the foregoing object, according to a seventh aspect of the present invention, there is provided a waveform measuring apparatus having a sampling portion having a reference signal oscillator, for sampling a signal under test by means of a sampling signal having a cycle longer than a repetition cycle of the signal under test outputted from a signal under test generator for generating a signal under test having a repetition cycle set by employing a reference signal generated by the reference signal oscillator; and a data processing portion for obtaining an enveloped waveform of a signal under test sampled by this sampling portion, thereby obtaining a signal waveform of the signal under test from this enveloped waveform, the waveform measuring apparatus comprising:

a sampling signal generator circuit having a reference signal input terminal wherein a reference signal common to a reference signal generated by the reference signal oscillator of the signal under test generator is applied to the reference signal input terminal; and a sampling frequency setting portion for setting to the sampling signal generator circuit a sampling frequency such that a desired delay time can be obtained relevant to a phase of the signal under test, wherein, in the sampling signal generator circuit, when the sampling signal having a cycle that corresponds to the sampling frequency is generated based on the common reference signal and the sampling frequency, the repetition cycle of the signal under test and the repetition cycle of the sampling signal are set based on a cycle of the common reference signal so that the repetition cycle of the sampling signal can be set independent of the repetition cycle of the signal under test.

In the thus configured waveform measuring apparatus, a reference signal oscillator for generating a reference signal that has a reference frequency employed for generating a repetition frequency of a signal under test is provided in a signal generator targeted for testing, the signal generator outputting a signal under test of which a signal waveform is measured by means of the waveform measuring apparatus.

In contrast, in the waveform measuring apparatus, a reference signal oscillator for generating a reference signal is not provided.

Then, a sampling signal is generated by employing a reference signal common to a reference signal outputted from a reference signal oscillator provided in a signal generator targeted for testing.

Therefore, the signal under test and sampling signal are generated by employing a common reference signal outputted from the same reference signal oscillator, thus making it possible to achieve the same advantageous effect as that according to the second aspect.

In addition, in order to achieve the foregoing object, according to an eighth aspect of the present invention, there is provided a waveform measuring apparatus in accordance with the seventh aspect, further comprising a frequency measuring portion for measuring a repetition frequency of the signal under test, based on the reference signal output from the reference signal oscillator, wherein the measurement value of the repetition frequency of the signal under test measured by means of the frequency measuring portion is assigned to the sampling frequency setting portion.

In addition, in order to achieve the foregoing object, according to a ninth aspect of the present invention, there is provided a waveform measuring apparatus in accordance with the seventh aspect, further comprising:

a power divider for, when the signal under test is an optical signal, power dividing the signal under test that is the optical signal in two ways;

a photo detector for converting into a signal under test of an electrical signal a signal under test that is one optical signal divided by means of the power divider; and a frequency measuring portion for measuring a repetition frequency of a signal under test converted into an electrical signal by means of the photo detector, based on the reference signal output from the reference signal oscillator, wherein the measurement value of the repetition frequency of the signal under test measured by means of the frequency measuring portion is assigned to the sampling frequency setting portion.

In addition, in order to achieve the foregoing object, according to a tenth aspect of the present invention, there is provided a waveform measuring apparatus in accordance with the seventh aspect, further comprising:

a power divider for, when the signal under test is an optical signal, power dividing the signal under test that is the optical signal in two ways;

a clock recovery for detecting a clock of a repetition cycle from one signal under test divided by the power divider, thereby converting a signal under test that is the optical signal into a signal under test of an electrical signal having the repetition frequency and outputting the converted signal; and a frequency measuring portion for measuring a repetition frequency of a signal under test converted into an electrical signal by means of the clock recovery, based on the reference signal output from the reference signal oscillator, wherein the measurement value of the repetition frequency of the signal under test measured by means of the frequency measuring portion is assigned to the sampling frequency setting portion.

In addition, in order to achieve the foregoing object, according to an eleventh aspect of the present invention, there is provided a waveform measuring apparatus in accordance with the seventh aspect, further comprising:

a photo detector for, when the signal under test is an optical signal, and the sampling portion is an electro-absorption modulator, light receiving a signal under test of an optical signal sampled by means of a sampling signal of which a signal under test being the optical signal is inputted from the sampling signal generator circuit, and converting into a signal under test of an electrical signal a signal under test that is an optical signal after sampled;

an analog/digital converter for converting a signal under test converted into an electrical signal by means of the photo detector into a digital signal under test, thereby delivering the converted digital signal under test to the data processing portion; and a display for converting a scale of a time axis of the enveloped waveform obtained by means of the data processing portion into a scale of an original signal under test, and displaying a signal waveform of the signal under test.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIG. 1 is a block diagram depicting a schematic configuration of a waveform measuring apparatus to which a waveform measuring method according to a first embodiment of the present invention is applied;

FIG. 3 is a block diagram depicting a schematic configuration of a waveform measuring apparatus to which a waveform measuring method according to a second embodiment of the present embodiment is applied;

FIG. 4 is a block diagram depicting a schematic configuration of a waveform measuring apparatus to which a waveform measuring method according to a third embodiment of the present invention is applied;

FIGS. 5A, 5B, 5C, and 5D are waveform charts of a signal under test and a reproduction clock signal illustrating an advantageous effect of a clock recovery incorporated in a waveform measuring apparatus according to the third embodiment of the present invention;

FIG. 6 is a block diagram depicting a schematic configuration of a waveform measuring apparatus to which a waveform measuring method according to a fourth embodiment of the present invention is applied;

FIGS. 7A, 7B, and 7C are views each illustrating principles in which a signal waveform of a conventional typical signal under test is obtained by employing a sampling technique; and FIG. 8 is a block diagram depicting a schematic configuration of a conventional waveform measuring instrument.

DETAILED DESCRIPTION OF THE INVENTION

Figure 2:
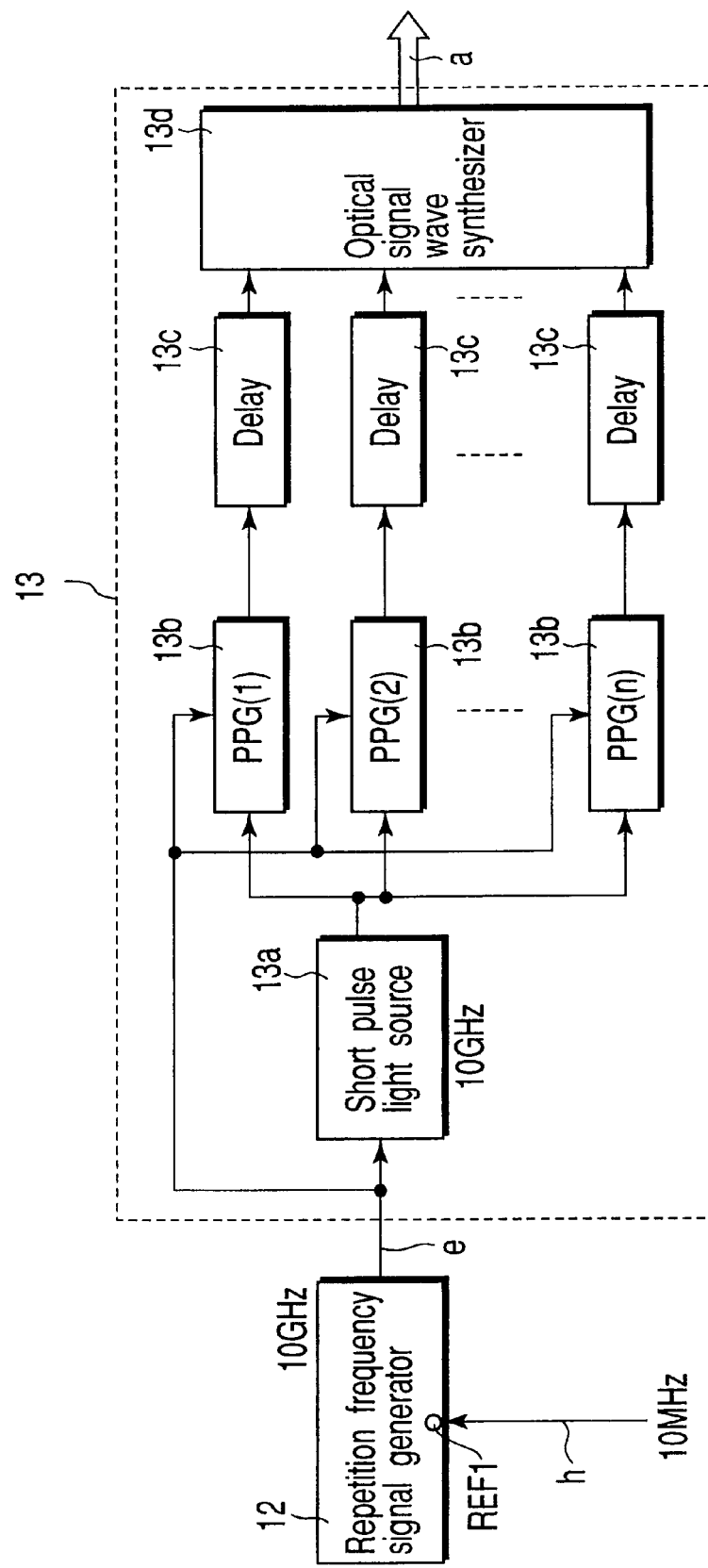
FIG. 2 is a block diagram depicting a schematic configuration of a signal generator for generating a signal under test measured by a waveform measuring method according to the first embodiment of the present invention.

Reference will now be made in detail to the presently preferred embodiments of the invention as illustrated in the accompanying drawings, in which like reference numerals designate like or corresponding parts.

Hereinafter, preferred embodiments of the present invention will be described with reference to the accompanying drawings.
(First Embodiment)

FIG. 1 is a block diagram depicting a schematic configuration of a waveform measuring apparatus to which a waveform measuring method according to a first embodiment of the present invention is applied.

That is, as shown in FIG. 1, a repetition frequency signal generator 12 and a waveform pattern generator 13 are provided in a signal under test generator 11 that is a test target for outputting a signal under test "a" that is an optical signal.

A reference signal "h" having a 10 MHz reference frequency "fs" (=10 MHz), for example, is applied from a reference signal generator 14 incorporated in a waveform measuring apparatus to a reference signal input terminal (REF1) of a repetition signal generator 12 in this signal under test generator 11.

FIG. 2 is a block diagram depicting an internal configuration of a signal under test generator 11 in FIG. 1.

That is, as shown in FIG. 2, for example, a repetition frequency signal generator 12 composed of a frequency synthesizer multiplies or frequency-divides a reference signal "h" having a reference frequency "fa" (=10 MHz) applied to the reference signal input terminal (REF1), thereby making it possible to generate a repetition frequency signal "e" having an arbitrary frequency (repetition frequency "fa").

Specifically, the repetition signal generator 12 multiplies the reference signal "h" by 1000 times, thereby generating a repetition frequency signal "e" having a 10 GHz frequency (repetition frequency "fa").

Then, this repetition frequency signal generator 12 delivers the generated repetition frequency signal "e" to a short pulse light source 13a of a next waveform pattern generating portion 13.

This short pulse light source 13a is composed of a semiconductor laser light source that emits a single waveform light, for example, generates an optical signal having a frequency "fa" of the inputted repetition frequency signal "e", and delivers the signal to a plurality of PPG (pulse pattern generator) 13b.

A pulse pattern containing preset data to be transmitted is stored in each PPG (pulse pattern generator) 13b, respectively, and the inputted optical signal is modulated by this pulse pattern.

Optical signals containing a variety of data outputted from each PPG (pulse pattern generator) 13b are wave-synthesized by means of an optical signal wave synthesizer 13d, respectively, after being delayed by a predetermined time so that data is not duplicated mutually by means of each delay circuit 13c, thereby obtaining a signal under test "a" having a repetition frequency "fa" (repetition cycle Ta).

Therefore, the waveform of data set by each PPG (pulse pattern generator) 13b is contained in one repetition cycle Ta in this signal under test "a".

In this way, the signal under test "a" having a repetition cycle Ta outputted from a signal under test generator 11 is incident to an electro-absorption modulator 15 in FIG. 1.

On the other hand, a reference signal oscillator 14 incorporated in a waveform measuring apparatus oscillates a reference signal "h" having a 10 MHz reference frequency "fs" (=10 MHz), for example, applies this reference signal "h" to a reference signal input terminal (REF1) of a signal under test generator 11, and applies the signal to a reference signal input terminal (REF2) of a frequency synthesized signal generator 17 of a sampling signal generator circuit 16.

Here, the frequency synthesized signal generator 17 in the sampling signal generator circuit 16 is composed of a frequency synthesizer as in the repetition frequency signal generator 12 described previously, and the reference signal "h" having a reference frequency "fs" (=10 MHz) applied to the reference signal input terminal (REF2) is multiplied or frequency divided, thereby making it possible to generate an arbitrary frequency signal.

Specifically, this frequency synthesized signal generator 17 generates a sine wave signal having a frequency "fb" of a repetition frequency of a sampling signal "b" outputted from a sampling signal generator circuit 16.

The repetition frequency "fb" of this sampling signal "b" is specified from a sampling frequency setting portion 20 in a control portion 19.

Here, when a relationship between the repetition frequency "fb" of the sampling signal "b" and the repetition frequency "fa" of the signal under test "a" is verified, if fa=10 GHz and fb=999.9 MHz are substituted in formula (1) described previously, formula (1) is met where n=10, Δf =0.1 MHz, for example, from 999.9 MHz=(10 Ghz/n)−Δf.

A sine wave signal having a frequency "fb" outputted from such a frequency synthesized signal generator 17 is waveform trimmed into a pulse waveform shaped sampling signal "b" having a repetition frequency "fb" (repetition cycle Tb) as shown in FIG. 7B.

Then, the sampling signal "b" having the repetition frequency "fb" outputted from the sampling signal generator circuit 16 is inputted to the electro-absorption modulator 15.

This electro-absorption modulator 15, as described previously, samples the signal under test "a" of an incident optical signal by means of a sampling signal "b" inputted from the sampling signal generator circuit 16, and outputs a signal under test "c" of the sampled optical signal to a photo detector 21.

This photo detector 21 converts a signal under test "c" of an incident optical signal after sampled into a signal under test "c1" of an electrical signal.

Then, the signal under test "c1" outputted from the photo detector 21 is converted into a sampled digital signal under test "c2" by means of an analog/digital (A/D) converter 22, and is inputted to a data processing portion 23.

This data processing portion 23 calculates an enveloped waveform of the inputted, sampled signal under test "c2", converts a scale of a time axis of this enveloped waveform into a scale of an original signal under test "a", and outputs and displays a signal waveform "d" of the signal under test "a" on a display portion 24.

The signal waveform "d" of the signal under test "a" displayed on the display portion 24 may be drifted on the display screen because the repetition frequency "fa" of the repetition frequency signal "e" generated by the repetition frequency signal generator 12 and the repetition frequency "fb" of a sine wave signal generated by the frequency synthesized signal generator 17 do not meet formula (1) precisely.

In such a case, a display control portion 25 of a control portion 19 monitors a signal waveform "d" of a signal under test "a" displayed on the display portion 24, and adjusts a scanning (sweeping) start position of the signal waveform on the display screen every time so as not generate this drift apparently.

In thus configured waveform measuring instrument according to the first embodiment, a common reference signal "h" having a reference frequency "fs" outputted from the same reference signal oscillator 14 provided at the waveform measuring apparatus is supplied to a reference signal input terminal (REF2) of the frequency synthesized signal generator 17 in the sampling signal generator circuit 16 and a reference signal input terminal (REF1) of the repetition frequency signal generator 12 in the signal under test generator 11.

Here, the frequency synthesized signal generator 17 of the sampling signal generator circuit 16 and the repetition frequency signal generator 12 of the signal under test generator 11 frequency-divides or multiplies the reference signal "h", thereby generating a sine wave signal and repetition frequency signal "e".

Therefore, the sampling signal "b" and signal under test "a" generated from these sine wave signal and repetition frequency signal "e" always maintains a phase synchronized state.

Moreover, the sampling signal "b" obtains the reference signal "h" by processing it instead of obtaining the signal under test "a" by processing it.

Hence, a sampling frequency setting portion 20 of a control portion 19 can arbitrarily set a repetition frequency "fb" of a sampling signal "b" for sampling a signal under test "a" by employing an electro-absorption modulator 15 independent of a repetition frequency "fa" of a measurement "a".

As a result, the waveform measuring method and apparatus according to the first embodiment of the present invention can measure a signal waveform "d" of a signal under test "a" with an arbitrary resolution. In addition, jitter generation is restricted because a phase synchronization is always obtained relevant to the signal under test "a", and the measurement precision of the signal waveform "d" of the signal under test "a" can be remarkably improved.

(Second Embodiment)

FIG. 3 is a block diagram depicting a schematic configuration of a waveform measuring apparatus to which the waveform measuring method according to a second embodiment of the present invention is applied.

In FIG. 3, like elements of the waveform measuring apparatus according to the first embodiment shown in FIG. 1 are designated by like reference numerals. A duplicate detailed description is omitted here.

In this waveform measuring apparatus according to the second embodiment, a signal under test "a" having a repetition frequency "fa" outputted from a signal under test generator 11 is incident intact to an electro-absorption modulator 15, is divided by a power divider 26, and is incident to a photo detector 27.

This photo detector 27 converts the signal under test "a" of the incident optical signal into a signal under test "a" of the electrical signal, and delivers the converted signal to a frequency counter 28.

This frequency counter 28 measures a repetition frequency "fa" of the signal under test "a1" of the inputted electrical signal, and delivers data on the measured repetition frequency fa to a sampling frequency setting portion 20 of a control portion 19.

A reference signal "h" is inputted from a reference signal oscillator 14 in order to obtain synchronization between a timing of a clock (waveform) of the signal under test "a1" and a timing of a clock count.

Then, a sampling frequency setting portion 20a of the control portion 19 calculates a repetition frequency "fb" of the sampling signal "b" outputted from a sampling signal generator circuit 16 by employing the previously described formula (1) from the repetition frequency "fa" of the signal under test "a" inputted from a frequency counter 28.

That is, when fb=(fa/n)−Δf, for example, in the case where n=10, Δf=0.1 MHz, and the measurement value fa=10 GHz, the repetition frequency "fb" of the sampling signal "b" is obtained as fb=999.9 MHz.

Then, the sampling frequency setting portion 20 sets the calculated repetition frequency "fb" to a frequency synthesized signal generator 17 of a sampling signal generator circuit 16.

This frequency synthesized signal generator 17 generates a sine wave signal having a repetition frequency "fb" and delivers the signal to a next waveform trimmer circuit 18 by employing a reference signal "h", like a frequency synthesized signal generator 17 in the waveform measuring apparatus according to the first embodiment shown in FIG. 1.

The subsequent operation is identical to that of the waveform measuring method and apparatus according to the first embodiment shown in FIG. 1.

In the thus configured waveform measuring method and apparatus according to the second embodiment, the repetition frequency "fa" of the signal under test "a" is measured by a frequency counter 28, based on the reference signal "h" output from the reference signal oscillator 14, and a repetition frequency "fb" of a sampling signal "b" is obtained from this repetition frequency "fa" and set to the frequency synthesized signal generator 17. Thus, like the waveform measuring method and apparatus according to the first embodiment, the signal waveform "d" of the signal under test "a" can be measured with arbitrary resolution precision with a jitter generation quantity being restricted.

Further, in this waveform measuring method and apparatus according to the second embodiment, even if a repetition frequency "fa" of a signal under test "a" is unknown, the signal waveform "d" of the signal under test "a" can be correctly measured.

(Third Embodiment)

FIG. 4 is a block diagram depicting a schematic configuration of a waveform measuring apparatus to which a waveform measuring method according to a third embodiment of the present invention is applied.

In FIG. 4, like elements of the waveform measuring apparatus according to the second embodiment shown in FIG. 3 are designated by like reference numerals. A duplicate detailed description is omitted here.

In this waveform measuring apparatus according to the third embodiment, a signal under test "a" having a repetition frequency "fa" outputted from a signal under test generator 11 is incident intact to an electro-absorption modulator 15, is divided by a power divider 26, and is incident to a clock recovery 29.

Figure 5A:
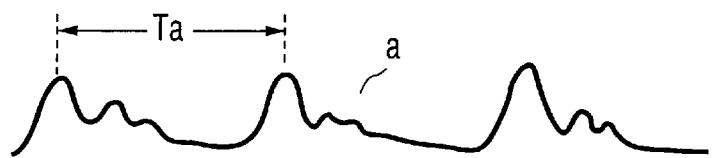

This clock recovery 29 detects a start timing of a repetition cycle "Ta" in a signal under test "a" that is an incident optical signal, i.e., a clock of repetition cycle Ta (frequency "fa"), converts the signal under test "a" that is the incident optical signal into a recovery clock signal "g" as shown in FIG. 5D that is an electrical signal having a frequency "fa" (repetition frequency), and delivers the converted signal to a next frequency counter 28.

This frequency counter 28 measures a frequency (repetition frequency "fa") of a recovery clock signal "g" of an inputted electrical signal, and delivers data on the measured repetition frequency "fa" to a sampling frequency setting portion 20a of the control portion 19.

The subsequent operation is identical to that of the waveform measuring method and apparatus according to the second embodiment shown in FIG. 3.

In such waveform measuring method and apparatus according to the third embodiment as well, a repetition frequency "fa" of a signal under test "a" can be measured by means of a frequency counter 28, based on the reference signal "h" output from the reference signal oscillator 14. Thus, like the waveform measuring method and apparatus according to the second embodiment, the signal waveform "d" of the signal under test "a" can be measured with arbitrary resolution precision while jitter generation quantity is restricted.

Further, in the waveform measuring method and apparatus according to the third embodiment, a clock of a repetition cycle Ta (frequency "fa") is detected by employing a clock recovery 29, and a repetition clock signal "g" is delivered to a frequency counter 28.

Figure 5B:
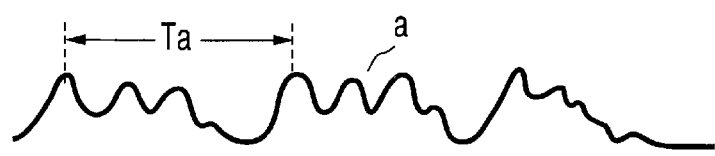
Figure 5C:
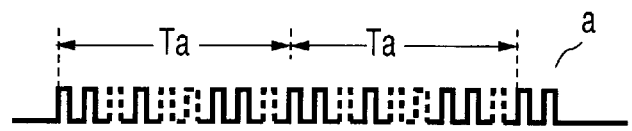

That is, like the waveform shown in FIG. 5B and FIG. 5C, the waveform of the signal under test "a" has a variety of shapes. Unlike the waveform shown in FIG. 5A, a clear one peak waveform does not always exist every repetition cycle Ta (frequency "fa").

Therefore, even if the frequency "fa" (repetition cycle Ta) of the signal under test "a" having such waveform is repeatedly counted directly by the frequency counter 28, based on the reference signal "h" output from the reference signal oscillator 14, a large number of peak waveforms or a small number of peak waveforms are counted, and there is a concern for outputting a mistaken repetition frequency "fa".

Therefore, a clock of the signal under test "a" is reproduced by employing a clock recovery 29, and a recovery clock signal "g" as shown in FIG. 5D is obtained, whereby, even if the signal under test "a" has a complicated waveform as shown in FIG. 5B and FIG. 5C, the repetition frequency "fa" (repetition cycle Ta) of the signal under test "a" can be detected with high precision.

(Fourth Embodiment)

FIG. 6 is a block diagram depicting a schematic configuration of a waveform measuring apparatus to which a waveform measuring method according to a fourth embodiment of the present invention is applied.

In FIG. 6, like elements of the waveform measuring apparatus according to the third embodiment shown in FIG. 4 are designated by like reference numerals. A duplicate detailed description is omitted here.

The waveform measuring method and apparatus according to the fourth embodiment is applied in the case where a reference signal oscillator 14 is incorporated in a signal under test generator 11, and a reference signal oscillator 14 is not provided at the waveform measuring apparatus.

Then, the reference signal oscillator 14 incorporated in the signal under test generator 11 oscillates a reference signal "h" having a reference frequency "fs", applies this reference signal "h" to a reference signal input terminal (RER1) of the repetition frequency signal generator 12 in the signal under test generator 11, and applies the signal to a reference signal input terminal (REF2) of the signal generator in the sampling signal generator circuit 16 at the waveform measuring apparatus.

The other configuration is identical to that of the waveform measuring apparatus according to the third embodiment shown in FIG. 4.

In such waveform measuring method and apparatus according to the fourth embodiment as well, the signal under test "a" outputted from the signal under test generator 11 and the sampling signal "b" outputted from the sampling signal generator circuit 16 completely maintain a phase synchronized state, and the repetition frequency "fb" of the sampling signal "b" can be set independently of the repetition frequency "fa" of the signal under test "a". This makes it possible to achieve advantageous effect that is substantially identical to that of the waveform measuring method and apparatus according to the third embodiment shown in FIG. 4.

Further, in the waveform measuring method and apparatus according to the fourth embodiment, the reference signal "h" from the signal under test generator 11 for outputting the signal under test "a" is use for generating the sampling signal "b", thus making it possible to simplify a configuration of the entire waveform measuring apparatus.

The present invention is not limited to a configuration of the waveform measuring method and apparatus according to the above described second, third, and fourth embodiments.

For example, in he waveform measuring method and apparatus according to the second, third, and fourth embodiments, the repetition frequency "fa" of the signal under test "a" measured by the frequency counter 28 is automatically set to the sampling frequency setting portion 20a of the control portion 19.

However, an operator visually reads the measurement value (repetition frequency "fa" of the frequency counter 28 so that the operator may set the measurement value to the sampling frequency setting portion 20a of the control portion 19 by manual operation.

Further, in the first to fourth embodiments, although the signal under test "a" is assumed to be an optical signal, the signal under test "a" may be a general electrical signal.

In this case, a sampling circuit 1 applied to a general electrical signal shown in FIG. 8 is employed instead of the electro-absorption modulator 15 in the embodiments, and further, the photo detector 21 is eliminated.

As has been described above, in the waveform measuring apparatus according to the present invention, the repetition cycle of the signal under test and the repetition cycle of the sampling signal are generated by means of a common reference signal outputted from the same reference signal oscillator.

In this manner, in the waveform measuring method and apparatus according to the present invention, a repetition frequency of a sampling signal for sampling a signal under test outputted from a signal generator targeted for testing can be arbitrarily set independently of a repetition frequency of a signal under test while a sampling signal is always phase synchronized with a signal under test. Then, the measurement precision of the signal waveform of a signal under test is improved while a generated quantity of jitter is remarkably restricted, and a signal waveform can be measured with arbitrary resolution precision.

Therefore, according to the present invention, there can be provided a waveform measuring method and apparatus, wherein the repetition cycle of the signal under test and the cycle of the sampling signal are generated by a common reference signal, whereby a frequency of a sampling signal for sampling a signal under test outputted from a signal generator under test targeted for testing can be arbitrarily set independently of a repetition frequency of a signal under test while a sampling signal is always phase synchronized with a common reference signal; the measurement precision of the signal waveform of a signal under test is improved while a generated quantity of jitter is remarkably restricted; and a signal waveform can be measured with arbitrary resolution precision.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A waveform measuring method for generating a sampling signal that has a cycle longer than a repetition cycle of a signal under test outputted from a signal under test generator from a sampling signal generator circuit, sampling the signal under test by means of the sampling signal, and obtaining an enveloped waveform of the signal under test, thereby obtaining a signal waveform of the signal under test, comprising the steps of:

applying a common reference signal from the same reference signal generating portion to a reference signal input terminal of the signal under test generator and a reference signal input terminal of a sampling signal generator circuit;

setting to the sampling signal generator circuit a sampling frequency having a repetition frequency specified from a sampling frequency setting portion such that a desired delay time can be obtained relevant to a phase of the signal under test; and generating the sampling signal having a cycle that corresponds to the sampling frequency based on the common reference signal and the sampling frequency in the sampling signal generator circuit and the repetition frequency specified from the sampling frequency setting portion, wherein a repetition cycle of the signal under test and a repetition cycle of the sampling signal are set based on a repetition cycle of the common reference signal so that the repetition cycle of the sampling signal can be set arbitrarily and independently of the repetition cycle of the signal under test.

2. A waveform measuring apparatus having a sampling signal generator circuit for generating a sampling signal that has a cycle longer than a repetition cycle of a signal under test outputted from a signal under test generator; a sampling portion for sampling the signal under test by means of a sampling signal from the sampling signal generator circuit; and a data processing portion for obtaining an enveloped waveform of the signal under test sampled by means of the sampling portion, thereby obtaining a signal waveform of the signal under test, the waveform measuring apparatus comprising:

a reference signal generating portion for applying a common reference signal to a reference signal input terminal of the signal under test generator and a reference signal input terminal of the sampling signal generator circuit; and a sampling frequency setting portion for setting to the sampling signal generator circuit a sampling frequency such that a desired delay time can be obtained relevant to a phase of the signal under test, wherein, in the sampling signal generator circuit, when the sampling signal having a cycle that corresponds to the sampling frequency is generated based on the common reference signal and the sampling frequency, the repetition cycle of the signal under test and the repetition cycle of the sampling signal are set based on a repetition cycle of the common reference signal so that the repetition cycle of the sampling signal can be set arbitrarily and independently of the repetition cycle of the signal under test thereby specifying repetition frequency of the sampling frequency from the sampling frequency setting portion.

3. A waveform measuring apparatus according to claim 2, further comprising a frequency measuring portion for measuring a repetition frequency of the signal under test, based on the reference signal output from the reference signal oscillator, wherein a measurement value of the repetition frequency of the signal under test measured by means of the frequency measuring portion is assigned to the sampling frequency setting portion.

4. A waveform measuring apparatus according to claim 2, further comprising:

a power divider for, when the signal under test is an optical signal, power dividing the signal under test that is the optical signal into two ways;

a photo detector for converting a signal under test that is one of the optical signals divided by the power divider into a signal under test of an electrical signal; and a frequency measuring portion for measuring a repetition frequency of a signal under test converted into an electrical signal by means of the photo detector, based on the reference signal output from the reference signal oscillator, wherein a measurement value of the repetition frequency of the signal under test measured by means of the frequency measuring portion is assigned to the sampling frequency setting portion.

5. A waveform measuring apparatus according to claim 2, further comprising:
   a power divider for, when the signal under test is an optical signal, power dividing the signal under test that is the optical signal in two ways;
   a clock recovery for detecting a clock of the repetition cycle from one signal under test divided by the power divider, thereby converting the signal under test that is the optical signal into a signal under test of an electrical signal having the repetition frequency and outputting the converted electrical signal; and
   a frequency measuring portion for measuring a repetition frequency of a signal under test converted into an electrical signal by the clock recovery, based on the reference signal output from the reference signal oscillator,
   wherein a measurement value of the repetition frequency of the signal under test measured by means of the frequency measuring portion is assigned to the sampling frequency setting portion.

6. A waveform measuring apparatus according to claim 2, further comprising:
   a photo detector for, when the signal under test is an optical signal and the sampling portion is an electro-absorption modulator, light receiving a signal under test of an optical signal sampled by means of a sampling signal of which a signal under test being the optical signal is inputted from the sampling signal generator circuit by the electro-absorption modulator, and converting into a signal under test of an electrical signal as a signal under test that is an optical signal after sampling;
   an analog/digital converter for converting a signal under test converted into an electrical signal by means of the photo detector into a digital signal under test, thereby delivering the converted digital signal under test to the data processing portion; and
   a display for converting a scale of a time axis of the enveloped waveform obtained by means of the data processing portion into a scale of an original signal under test, and displaying the converted scale as a signal waveform of the signal under test.

7. A waveform measuring apparatus having a sampling portion having a reference signal oscillator, for sampling a signal under test by means of a sampling signal having a cycle longer than a repetition cycle of the signal under test outputted from a signal under test generator for generating a signal under test having, a repetition cycle set by employing a reference signal generated by the reference signal oscillator; and a data processing portion for obtaining an enveloped waveform of a signal under test sampled by this sampling portion, thereby obtaining a signal waveform of the signal under test from this enveloped waveform, the waveform measuring apparatus comprising:
   a sampling signal generator circuit having a reference signal input terminal wherein a reference signal common to a reference signal generated by the reference signal oscillator of the signal under test generator is applied to the reference signal input terminal; and
   a sampling frequency setting portion for setting to the sampling signal generator circuit a sampling frequency such that a desired delay time can be obtained relevant to a phase of the signal under test,
   wherein, in the sampling signal generator circuit, when the sampling signal having a repetition cycle that corresponds to the sampling frequency is generated based on the common reference signal and the sampling frequency, the repetition cycle of the signal under test and the repetition cycle of the sampling signal are set based on a cycle of the common reference signal so that the repetition cycle of the sampling signal can be set arbitrarily and independently of the repetition cycle of the signal under test thereby specifying a repetition frequency of the sampling frequency from the sampling frequency setting portion.

8. A waveform measuring apparatus according to claim 7, further comprising a frequency measuring portion for measuring a repetition frequency of the signal under test, based on the reference signal output from the reference signal oscillator,
   wherein a measurement value of the repetition frequency of the signal under test measured by means of the frequency measuring portion is assigned to the sampling frequency setting portion.

9. A waveform measuring apparatus according to claim 7, further comprising:
   a power divider for, when the signal under test is an optical signal, power dividing the signal under test that is the optical signal in two ways;
   a photo detector for converting a signal under test that is one of the optical signals divided by the power divider into a signal under test of an electrical signal; and
   a frequency measuring portion for measuring a repetition frequency of a signal under test converted into an electrical signal by means of the photo detector, based on the reference signal output from the reference signal oscillator,
   wherein a measurement value of the repetition frequency of the signal under test measured by means of the frequency measuring portion is assigned to the sampling frequency setting portion.

10. A waveform measuring apparatus according to claim 7, further comprising:
    a power divider for, when the signal under test is an optical signal, power dividing the signal under test that is the optical signal in two ways;
    a clock recovery for detecting a clock of a repetition cycle from one signal under test divided by the power divider, thereby converting a signal under test that is the optical signal into a signal under test of an electrical signal having the repetition frequency and outputting the converted electrical signal; and
    a frequency measuring portion for measuring a repetition frequency of a signal under test converted into an electrical signal by means of the clock recovery, based on the reference signal output from the reference signal oscillator,
    wherein a measurement value of the repetition frequency of the signal under test measured by means of the frequency measuring portion is assigned to the sampling frequency setting portion.

11. A waveform measuring apparatus according to claim 7, further comprising:
    a photo detector for, when the signal under test is an optical signal light, and the sampling portion is an electrical absorption type modulator, light receiving a signal under test of an optical signal sampled by means of a sampling signal of which a signal under test being the optical signal is inputted from the sampling signal generator circuit, and converting into a signal under test of an electrical signal as a signal under test that is an optical signal after sampling;

an analog/digital converter for converting a signal under test converted into an electrical signal by means of the photo detector into a digital signal under test, thereby delivering the converted digital signal under test to the data processing portion; and a display for converting a scale of a time axis of the enveloped waveform obtained by means of the data processing portion into a scale of an original signal under test, and displaying a signal waveform of the signal under test.

12. A waveform measuring apparatus having a sampling signal generator circuit for generating a sampling signal that has a cycle longer than a repetition cycle of a signal under test output from a signal under test generator, a sampling portion for sampling the signal under test by means of a sampling signal from the sampling signal generator circuit, and a data processing portion for obtaining an enveloped waveform of the signal under test sampled by means of the sampling portion, thereby obtaining a signal waveform of the signal under test, the waveform measuring apparatus comprising:

a reference signal generating portion for applying a common reference signal to a reference signal input terminal of the signal under test generator and a reference signal input terminal of the sampling signal generator circuit;

a sampling frequency setting portion for setting to the sampling signal generator circuit a sampling frequency such that a desired delay time can be obtained relevant to a phase of the signal under test; and a frequency measuring portion for measuring a repetition frequency of the signal under test, based on the reference signal output from the reference signal oscillator, wherein, in the sampling signal generator circuit, when the sampling signal having a cycle that corresponds to the sampling frequency is generated based on the common reference signal and the sampling frequency, the repetition cycle of the signal under test and the repetition cycle of the sampling signal are set based on a repetition cycle of the common reference signal so that the repetition cycle of the sampling signal can be set independently of the repetition cycle of the signal under test, and wherein a measurement value of the repetition frequency of the signal under test measured by means of the frequency measuring portion is assigned to the sampling frequency setting portion.

13. A waveform measuring apparatus having a sampling signal generator circuit for generating a sampling signal that has a cycle longer than a repetition cycle of a signal under test output from a signal under test generator, a sampling portion for sampling the signal under test by means of a sampling signal from the sampling signal generator circuit, and a data processing portion for obtaining an enveloped waveform of the signal under test sampled by means of the sampling portion, thereby obtaining a signal waveform of the signal under test, the waveform measuring apparatus comprising:

a reference signal generating portion for applying a common reference signal to a reference signal input terminal of the signal under test generator and a reference signal input terminal of the sampling signal generator circuit;

a sampling frequency setting portion for setting to the sampling signal generator circuit a sampling frequency such that a desired delay time can be obtained relevant to a phase of the signal under test;

a power divider for, when the signal under test is an optical signal, power dividing the signal under test that is the optical signal into two ways;

a photo detector for converting into a signal under test of an electrical signal a signal under test that is one of the optical signals divided by the power divider; and a frequency measuring portion for measuring a repetition frequency of a signal under test converted into an electrical signal by means of the photo detector, based on the reference signal output from the reference signal oscillator, wherein the measurement value of the repetition frequency of the signal under test measured by means of the frequency measuring portion is assigned to the sampling frequency setting portion, wherein, in the sampling signal generator circuit, when the sampling signal having a cycle that corresponds to the sampling frequency is generated based on the common reference signal and the sampling frequency, the repetition cycle of the signal under test and the repetition cycle of the sampling signal are set based on a repetition cycle of the common reference signal so that the repetition cycle of the sampling signal can be set independently of the repetition cycle of the signal under test.

14. A waveform measuring apparatus having a sampling signal generator circuit for generating a sampling signal that has a cycle longer than a repetition cycle of a signal under test output from a signal under test generator, a sampling portion for sampling the signal under test by means of a sampling signal from the sampling signal generator circuit, and a data processing portion for obtaining an enveloped waveform of the signal under test sampled by means of the sampling portion, thereby obtaining a signal waveform of the signal under test, the waveform measuring apparatus comprising:

a reference signal generating portion for applying a common reference signal to a reference signal input terminal of the signal under test generator and a reference signal input terminal of the sampling signal generator circuit;

a sampling frequency setting portion for setting to the sampling signal generator circuit a sampling frequency such that a desired delay time can be obtained relevant to a phase of the signal under test;

a power divider for, when the signal under test is an optical signal, power dividing the signal under test that is the optical signal in two ways;

a clock recovery for detecting a clock of the repetition cycle from one signal under test divided by the power divider, thereby converting the signal under test that is the optical signal into a signal under test of an electrical signal having the repetition frequency and outputting the converted electrical signal; and a frequency measuring portion for measuring a repetition frequency of a signal under test converted into an electrical signal by the clock recovery, based on the reference signal output from the reference signal oscillator, wherein, in the sampling signal generator circuit, when the sampling signal having a cycle that corresponds to the sampling frequency is generated based on the common reference signal and the sampling frequency, the repetition cycle of the signal under test and the repetition cycle of the sampling signal are set based on a repetition cycle of the common reference signal so that the repetition cycle of the sampling signal can be set independently of the repetition cycle of the signal under test, and wherein a measurement value of the repetition frequency of the signal under test measured by means of the frequency measuring portion is assigned to the sampling frequency setting portion.

15. A waveform measuring apparatus having a sampling signal generator circuit for generating a sampling signal that has a cycle longer than a repetition cycle of a signal under test output from a signal under test generator, a sampling portion for sampling the signal under test by means of a sampling signal from the sampling signal generator circuit, and a data processing portion for obtaining an enveloped waveform of the signal under test sampled by means of the sampling portion, thereby obtaining a signal waveform of the signal under test, the waveform measuring apparatus comprising:

a reference signal generating portion for applying a common reference signal to a reference signal input terminal of the signal under test generator and a reference signal input terminal of the sampling signal generator circuit;

a sampling frequency setting portion for setting to the sampling signal generator circuit a sampling frequency such that a desired delay time can be obtained relevant to a phase of the signal under test;

a photo detector for, when the signal under test is an optical signal and the sampling portion is an electro-absorption modulator, light receiving a signal under test of an optical signal sampled by means of a sampling signal of which a signal under test being the optical signal is inputted from the sampling signal generator circuit by the electro-absorption modulator, and converting into a signal under test of an electrical signal as a signal under test that is an optical signal after sampling;

an analog/digital converter for converting a signal under test converted into an electrical signal by means of the photo detector into a digital signal under test, thereby delivering the converted digital signal under test to the data processing portion; and a display for converting a scale of a time axis of the enveloped waveform obtained by means of the data processing portion into a scale of an original signal under test, and displaying the converted scale as a signal waveform of the signal under test, wherein, in the sampling signal generator circuit, when the sampling signal having a cycle that corresponds to the sampling frequency is generated based on the common reference signal and the sampling frequency, the repetition cycle of the signal under test and the repetition cycle of the sampling signal are set based on a repetition cycle of the common reference signal so that the repetition cycle of the sampling signal can be set independently of the repetition cycle of the signal under test.

16. A waveform measuring apparatus having a sampling portion having a reference signal oscillator, for sampling a signal under test by means of a sampling signal having a cycle longer than a repetition cycle of the signal under test output from a signal under test generator for generating a signal under test having a repetition cycle set by employing a reference signal generated by the reference signal oscillator, and a data processing portion for obtaining an enveloped waveform of a signal under test sampled by this sampling portion, thereby obtaining a signal waveform of the signal under test from this enveloped waveform, the waveform measuring apparatus comprising:

a sampling signal generator circuit having a reference signal input terminal wherein a reference signal common to a reference signal generated by the reference signal oscillator of the signal under test generator is applied to the reference signal input terminal;

a sampling frequency setting portion for setting to the sampling signal generator circuit a sampling frequency such that a desired delay time can be obtained relevant to a phase of the signal under test; and a frequency measuring portion for measuring a repetition frequency of the signal under test, based on the reference signal output from the reference signal oscillator;

wherein, in the sampling signal generator circuit, when the sampling signal having a cycle that corresponds to the sampling frequency is generated based on the common reference signal and the sampling frequency, the repetition cycle of the signal under test and the repetition cycle of the sampling signal are set based on a repetition cycle of the common reference signal so that the repetition cycle of the sampling signal can be set independent of the repetition cycle of the signal under test, and wherein a measurement value of the repetition frequency of the signal under test measured by means of the frequency measuring portion is assigned to the sampling frequency setting portion.

17. A waveform measuring apparatus having a sampling portion having a reference signal oscillator, for sampling a signal under test by means of a sampling signal having a cycle longer than a repetition cycle of the signal under test output from a signal under test generator for generating a signal under test having a repetition cycle set by employing a reference signal generated by the reference signal oscillator, and a data processing portion for obtaining an enveloped waveform of a signal under test sampled by this sampling portion, thereby obtaining a signal waveform of the signal under test from this enveloped waveform, the waveform measuring apparatus comprising:

a sampling signal generator circuit having a reference signal input terminal wherein a reference signal common to a reference signal generated by the reference signal oscillator of the signal under test generator is applied to the reference signal input terminal;

a sampling frequency setting portion for setting to the sampling signal generator circuit a sampling frequency such that a desired delay time can be obtained relevant to a phase of the signal under test;

a power divider for, when the signal under test is an optical signal, power dividing the signal under test that is the optical signal in two ways;

a photo detector for converting into a signal under test of an electrical signal a signal under test that is one optical signal divided by means of the power divider; and a frequency measuring portion for measuring a repetition frequency of a signal under test converted into an electrical signal by means of the photo detector, based on the reference signal output from the reference signal oscillator, wherein, in the sampling signal generator circuit, when the sampling signal having a cycle that corresponds to the sampling frequency is generated based on the common reference signal and the sampling frequency, the repetition cycle of the signal under test and the repetition cycle of the sampling signal are set based on a repetition cycle of the common reference signal so that the repetition cycle of the sampling signal can be set independent of the repetition cycle of the signal under test, and wherein a measurement value of the repetition frequency of the signal under test measured by means of the frequency measuring portion is assigned to the sampling frequency setting portion.

18. A waveform measuring apparatus having a sampling portion having a reference signal oscillator, for sampling a signal under test by means of a sampling signal having a cycle longer than a repetition cycle of the signal under test output from a signal under test generator for generating a signal under test having a repetition cycle set by employing a reference signal generated by the reference signal oscillator, and a data processing portion for obtaining an enveloped waveform of a signal under test sampled by this sampling portion, thereby obtaining a signal waveform of the signal under test from this enveloped waveform, the waveform measuring apparatus comprising:

a sampling signal generator circuit having a reference signal input terminal wherein a reference signal common to a reference signal generated by the reference signal oscillator of the signal under test generator is applied to the reference signal input terminal;

a sampling frequency setting portion for setting to the sampling signal generator circuit a sampling frequency such that a desired delay time can be obtained relevant to a phase of the signal under test;

a power divider for, when the signal under test is an optical signal, power dividing the signal under test that is the optical signal in two ways;

a clock recovery for detecting a clock of a repetition cycle from one signal under test divided by the power divider, thereby converting a signal under test that is the optical signal into a signal under test of an electrical signal having the repetition frequency and outputting the converted electrical signal; and a frequency measuring portion for measuring a repetition frequency of a signal under test converted into an electrical signal by means of the clock recovery, based on the reference signal output from the reference signal oscillator, wherein, in the sampling signal generator circuit, when the sampling signal having a cycle that corresponds to the sampling frequency is generated based on the common reference signal and the sampling frequency, the repetition cycle of the signal under test and the repetition cycle of the sampling signal are set based on a repetition cycle of the common reference signal so that the repetition cycle of the sampling signal can be set independent of the repetition cycle of the signal under test, and wherein a measurement value of the repetition frequency of the signal under test measured by means of the frequency measuring portion is assigned to the sampling frequency setting portion.

19. A waveform measuring apparatus having a sampling portion having a reference signal oscillator, for sampling a signal under test by means of a sampling signal having a cycle longer than a repetition cycle of the signal under test output from a signal under test generator for generating a signal under test having a repetition cycle set by employing a reference signal generated by the reference signal oscillator, and a data processing portion for obtaining an enveloped waveform of a signal under test sampled by this sampling portion, thereby obtaining a signal waveform of the signal under test from this enveloped waveform, the waveform measuring apparatus comprising:

a sampling signal generator circuit having a reference signal input terminal wherein a reference signal common to a reference signal generated by the reference signal oscillator of the signal under test generator is applied to the reference signal input terminal;

a sampling frequency setting portion for setting to the sampling signal generator circuit a sampling frequency such that a desired delay time can be obtained relevant to a phase of the signal under test;

a photo detector for, when the signal under test is an optical signal light, and the sampling portion is an electrical absorption type modulator, light receiving a signal under test of an optical signal sampled by means of a sampling signal of which a signal under test being the optical signal is inputted from the sampling signal generator circuit, and converting into a signal under test of an electrical signal as a signal under test that is an optical signal after sampling;

an analog/digital converter for converting a signal under test converted into an electrical signal by means of the photo detector into a digital signal under test, thereby delivering the converted digital signal under test to the data processing portion; and a display for converting a scale of a time axis of the enveloped waveform obtained by means of the data processing portion into a scale of an original signal under test, and displaying a signal waveform of the signal under test, wherein, in the sampling signal generator circuit, when the sampling signal having a cycle that corresponds to the sampling frequency is generated based on the common reference signal and the sampling frequency, the repetition cycle of the signal under test and the repetition cycle of the sampling signal are set based on a repetition cycle of the common reference signal so that the repetition cycle of the sampling signal can be set independent of the repetition cycle of the signal under test.

* * * * *